(12) United States Patent
Lin

(10) Patent No.: US 11,705,395 B2
(45) Date of Patent: Jul. 18, 2023

(54) CORE FILL TO REDUCE DISHING AND METAL PILLAR FILL TO INCREASE METAL DENSITY OF INTERCONNECTS

(71) Applicant: Intel Corporation, Santa Clara, CA (US)

(72) Inventor: Kevin Lin, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1086 days.

(21) Appl. No.: 16/017,962

(22) Filed: Jun. 25, 2018

(65) Prior Publication Data

US 2019/0393147 A1     Dec. 26, 2019

(51) Int. Cl.
*H01L 21/768*     (2006.01)
*H01L 23/522*     (2006.01)
(Continued)

(52) U.S. Cl.
CPC ...... *H01L 23/528* (2013.01); *H01L 21/76802* (2013.01); *H01L 21/76831* (2013.01);
(Continued)

(58) Field of Classification Search
CPC ............. H01L 23/528; H01L 21/76802; H01L 21/76831; H01L 21/76843;
(Continued)

(56) References Cited

U.S. PATENT DOCUMENTS 6,380,087 B1 *  4/2002  Gupta ..................... H01L 24/02
                                                         438/692
6,566,244 B1 *  5/2003  May .................. H01L 21/76829
                                                         438/622

(Continued)

OTHER PUBLICATIONS

C.S. Yang et. al; Mechanical property of the low dielectric carbon doped silicon oxide thin film grown from MTMS/O2 source; Department of Physics, Cheju National University, Ara 1, Jeju 690-756, Republic of Korea; Available online Sep. 21, 2005 (Year: 2005).*

(Continued)

*Primary Examiner* — Marcos D. Pizarro
*Assistant Examiner* — Tenley H Schofield
(74) *Attorney, Agent, or Firm* — Schwabe Williamson & Wyatt P.C.

(57) ABSTRACT

An integrated circuit structure comprises a first and second conductive structures formed in an interlayer dielectric (ILD) of a metallization stack over a substrate. The first conductive structure comprises a first conductive line, and first dummy structures located adjacent to one or more sides of the first conductive line, wherein the first dummy structures comprise respective arrays of dielectric core segments having a Young's modulus larger than the Young's modulus of the ILD, the dielectric core segments being approximately 1-3 microns in width and spaced apart by approximately 1-3 microns. The second conductive structure formed in the ILD comprises a conductive surface and second dummy structures formed in the conductive surface, where the second dummy structures comprising an array of conductive pillars.

15 Claims, 12 Drawing Sheets

(51) Int. Cl.
*H01L 23/00* (2006.01)
*H01L 23/31* (2006.01)
*H01L 23/495* (2006.01)
*H01L 23/528* (2006.01)
*H01L 23/532* (2006.01)

(52) U.S. Cl.
CPC .. *H01L 21/76843* (2013.01); *H01L 21/76877* (2013.01); *H01L 23/5226* (2013.01); *H01L 23/53228* (2013.01)

(58) Field of Classification Search
CPC ........... H01L 21/76877; H01L 23/5226; H01L 23/53228; H01L 23/522; H01L 21/7684; H01L 2924/0002; H01L 21/3212; H01L 2924/00; G03F 1/36
See application file for complete search history.

(56) References Cited

U.S. PATENT DOCUMENTS

| | | | | |
|---|---|---|---|---|
| 8,183,698 B2* | 5/2012 | Antol | .................... | H01L 23/528 257/780 |
| 2002/0036335 A1* | 3/2002 | Minami | ................ | H01F 41/042 257/531 |
| 2004/0115925 A1* | 6/2004 | Tseng | ................... | H01L 21/7684 438/633 |
| 2005/0035457 A1* | 2/2005 | Tomita | ................ | H01L 23/5329 257/758 |
| 2006/0022224 A1* | 2/2006 | Hiroi | ..................... | H01L 23/522 257/E21.582 |
| 2008/0153251 A1* | 6/2008 | Kostrzewa | ........ | H01L 21/76254 257/E21.568 |
| 2009/0096061 A1* | 4/2009 | Uchida | ................. | H01L 23/585 257/531 |
| 2009/0134497 A1* | 5/2009 | Barth | .................... | H01L 23/481 257/621 |
| 2010/0261095 A1* | 10/2010 | Grant | ................... | H01L 21/7684 430/5 |
| 2012/0305916 A1* | 12/2012 | Liu | ......................... | H01L 22/30 257/48 |
| 2013/0303002 A1* | 11/2013 | Oosterhuis | ........... | B29C 64/124 29/876 |

OTHER PUBLICATIONS

Intel Corporation, "Integrated Circuit Components With Dummy Structures", International Patent Application No. PCT/US2017/053594 filed Sep. 27, 2017, 39 pgs.

* cited by examiner

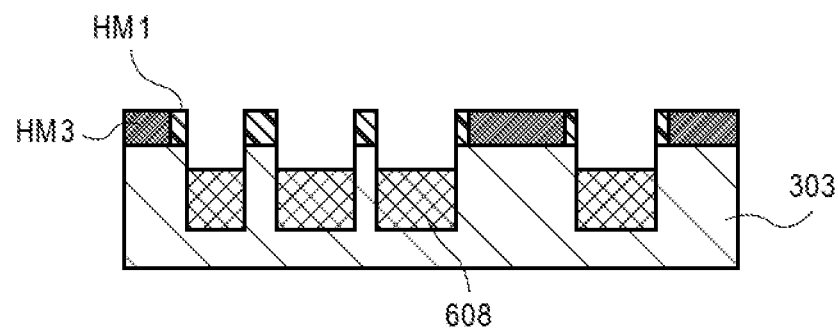
FIG. 6H-A
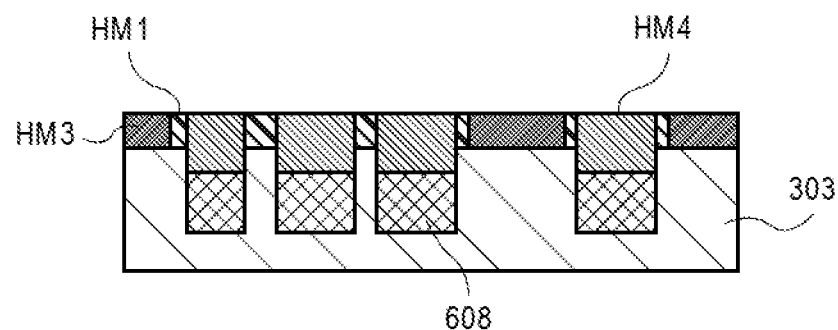
FIG. 6H-B
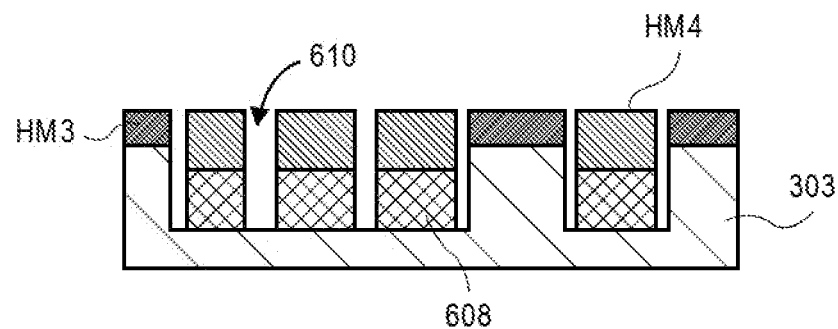
FIG. 6H-C
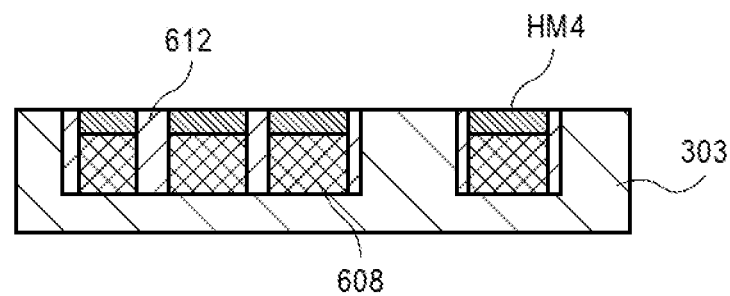
FIG. 6H-D

US 11,705,395 B2

CORE FILL TO REDUCE DISHING AND METAL PILLAR FILL TO INCREASE METAL DENSITY OF INTERCONNECTS

TECHNICAL FIELD

Embodiments of the disclosure are in the field of integrated circuit structures and, in particular, improved core fill to reduce dishing and metal pillar fill to increase metal density of interconnects.

BACKGROUND

Integrated circuit (IC) manufacturing often includes polishing operations to mechanically and/or chemically planarize a surface of an IC structure. For example, a surface of a component may be polished after the deposition of one material and before the deposition of another material. (e.g., a die, package substrate, interposer, etc.) to achieve a substantially flat surface on which further fabrication operations may be performed. However, the rate at which material is removed from a polished surface may depend on the material composition of that surface; when a surface includes multiple different materials, the resulting polished surface may be irregular.

This effect may be particularly pronounced when a surface includes large areas of a "softer" material (e.g., as measured by the Young's modulus of the material) between areas of a "harder" material. The large areas of the softer material may be polished away at a faster rate than the areas of the harder material, causing recesses in the softer material referred to as "dishing." For example, when two conductive lines (formed of a metal, such as copper) are spaced apart by a large region of interlayer dielectric (ILD) (e.g., silicon oxide or a carbon-doped silicon oxide film), the "softer" ILD may polish faster than the "harder" metal, resulting in concave depressions in the ILD between the conductive lines. Similarly, surfaces that include large areas of "harder" metal may also be difficult to polish uniformly, sometimes resulting in deformation of the surface.

To mitigate dishing or other deformations resulting from polishing, some IC structures are subject to design rules that require a minimum metal density across different sections of a surface that will be polished. Such design rules may specify a minimum and/or a maximum percentage of metal (e.g., between 10 percent copper and 80 percent copper) that must be present within different areas of the surface, limiting the range of possible sizes of ILD areas. In order to satisfy these design rules, metal dummy structures (using the same metal as the non-dummy structures, such as conductive lines and vias) may be incorporated into the IC structure. These metal dummy structures are not electrically connected to other elements in the IC structure but conventionally serve only to increase the local metal density and thus improve polishing performance.

However, the presence of conventional metal dummy structures may compromise electrical performance of some IC structures. For example, when metal dummy structures are located in the interior of an inductor, the metal dummy structures may generate eddy currents during operation of the inductor, generating losses by heat and reducing the inductance of the inductor. Further, using metal dummy structures may increase electromagnetic interference (e.g., with the metal dummy structures acting as antennas) and/or increase the risk of inadvertent electrical shorts (e.g., when a metal dummy structure inadvertently bridges two conductive pathways along which signals, power, or reference voltages are transmitted).

Problems with dishing or other deformations resulting from polishing may also occur in primarily metal structures. For example, high frequency interconnects may require large structures with 100% metal fill. Examples of such structures may include ground planes, inductors and capacitors. This is difficult to achieve for structures requiring a damascene process, i.e., overfilling a trench with copper and planarizing the copper to remove the excess copper, due to polish dishing and non-uniformity introduced from such regions of extremely high metal density.

DESCRIPTION OF THE EMBODIMENTS

Figure 1:
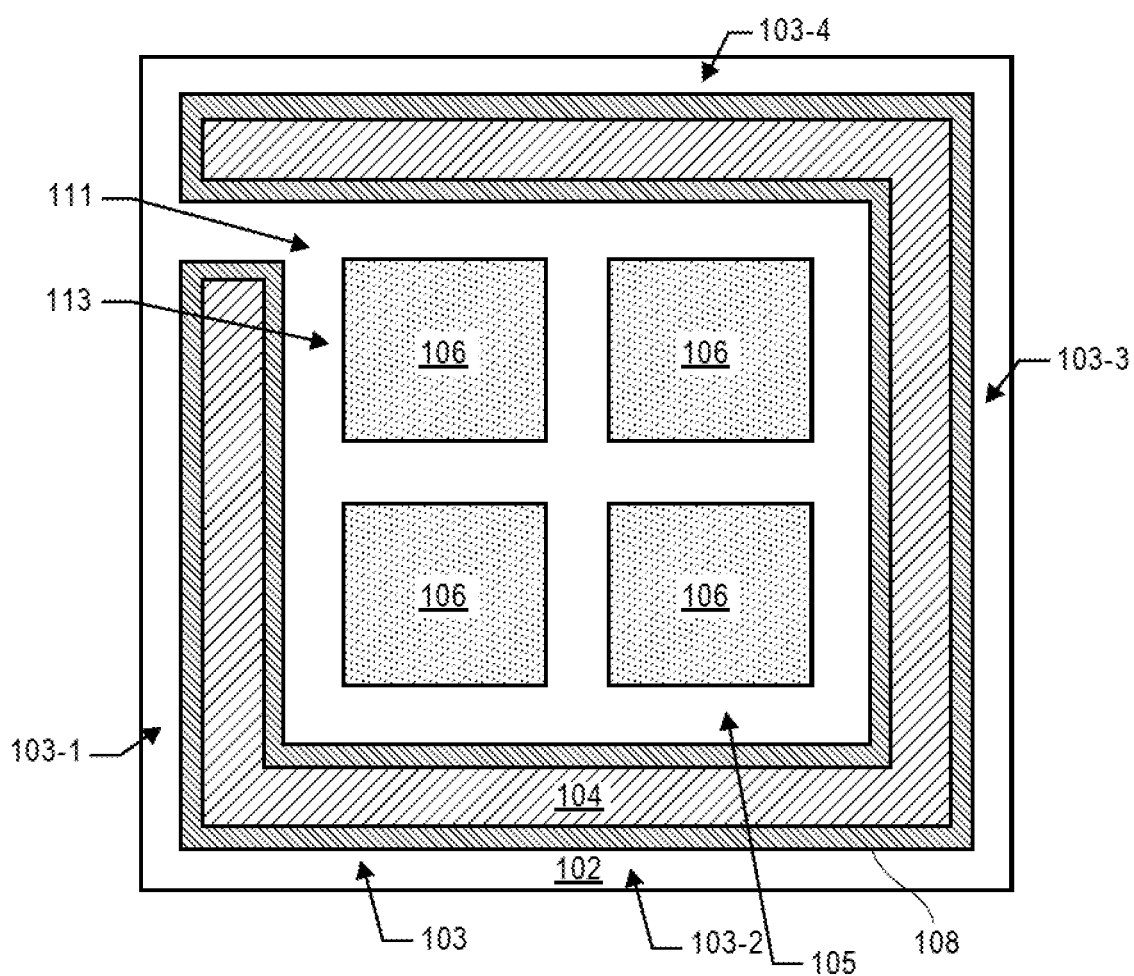
FIG. 1 illustrates a state of the art approach for providing dummy structures to mitigate dishing in a conductive structure, which in one embodiment shown comprises an inductor.

Conductive structures having improved core fill to reduce dishing and/or having a metal pillar fill to increase metal density of interconnects are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to conductive structures having improved core fill to reduce dishing and/or having a metal pillar fill to increase metal density of interconnects. Embodiments may include or pertain to one or more of dummy structures to mitigate polish dishing, inductors, ground planes, metallization stacks, and system-on-chip (SoC) technologies. One or more embodiments may be implemented to realize increased conductive structure performance due to the use of fill materials that reduce dishing to form a solid plane, and to increase polish process margin.

The present embodiments provide improvements for both dummy structures that mitigate dishing as well as for approaches for filling and polishing large metal structures.

To provide context, FIG. 1 illustrates a state of the art approach for providing dummy structures to mitigate dishing in a conductive structure, which in one embodiment shown comprises an inductor. FIG. 1 is a plan view of the IC structure 100 that includes a conductive structure 103 and multiple dummy structures 105 formed in an interlayer dielectric (ILD) 102 of a particular metal layer. The conductive structure 103 comprises four conductive interconnect segments 103-1, 103-2, 103-3, 103-4 arranged generally in the shape of a square having an open interior 111. The conductive structures 103 may comprise a conductive fill material 104, such as copper, and a liner material 108 (e.g., a diffusion barrier liner or an adhesion liner).

Rather than use metal dummification to mitigate dishing during polishing, one approach is to use dummy structures 105 comprised of a dielectric material 106 arranged as an array 113 of relatively large squares in the interior 111 of the conductive structure 103. The dielectric material 106 of dummy structures 105 has a Young's modulus (also referred to as the "elastic modulus" or "modulus of elasticity") that is larger than the Young's modulus of the ILD 102. When the dielectric dummy structures 105 have a higher Young's modulus than the ILD 102, dishing or other deformation during polishing may be mitigated, and undesirable eddy currents may be reduced. However, requiring dummification around the inductor reduces inductor quality factor (or Q), i.e., the ratio of the inductor's inductive reactance to its resistance at a given frequency. In addition, by introducing a dielectric material in place of metal dummification, the above approach requires new design rules for the IC structure 100.

Figure 2:
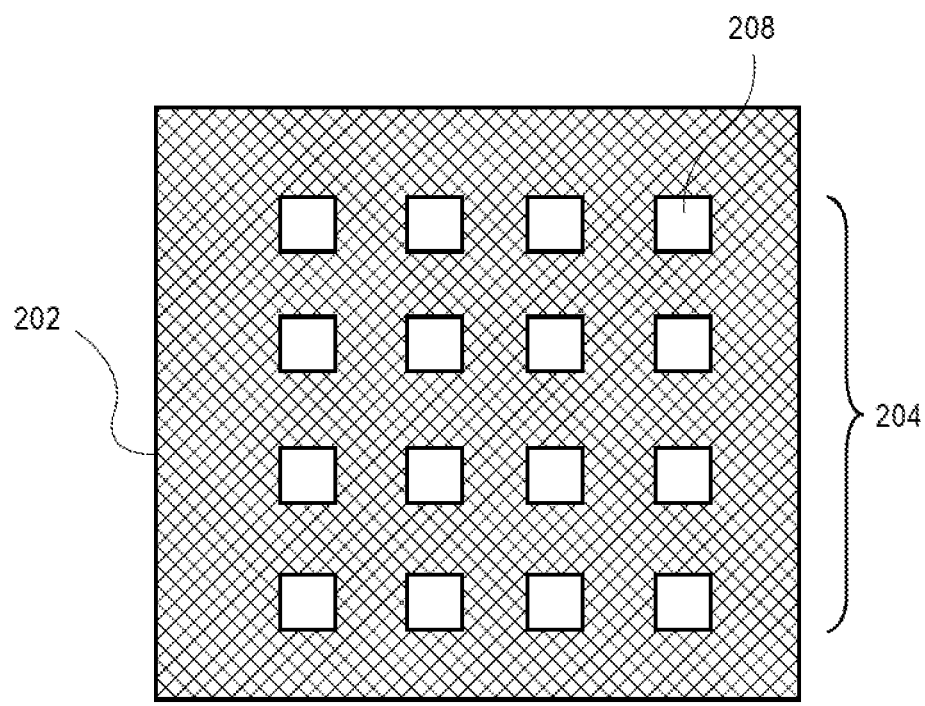
FIG. 2 illustrates a plan view of a ground plane and a state of the art approach for providing dummy structures to mitigate dishing in such a conductive structure.

Dummy structures have also been used to mitigate dishing in high-frequency interconnects that require large conductive structures with a high percentage of metal fill such as, for example, in ground planes, inductors and capacitors, as shown in FIG. 2.

FIG. 2 illustrates a plan view of a ground plane, and a state of the art approach for providing dummy structures to mitigate dishing in such a conductive structure. The ground plane 200 is a relatively large planar, or nearly planar horizontal, conductive surface 202, typically comprising a metal such as copper, which may or may not be connected to ground. Fabricating the ground plane 200 is difficult to achieve when the fabrication process requires a damascene process due to polish dishing non-uniformity introduced from regions of extremely high metal density. One technique to mitigate dishing problem is to fabricate a slotted plane of metal by introducing an array of pillars 204 or slots in the large planar conductive surface 202, where the pillars 204 are filled with a non-conducting interlayer dielectric (ILD) 208. Although the pillars 204 may be effective at mitigating polish dishing, the pillars 204 make the ground plane 200 less effective and less conductive by increasing resistance, which reduces device performance.

In accordance with one or more embodiments described herein, one or more conductive structures are disclosed that have improved core/pillar fill that reduce polish dishing. In one embodiment, a conductive structure is fabricated using single-mask spacer-based patterning that provides improved core fill. In a second embodiment, a conductive structure is provided that includes a metal fill that increases the metal density of the structure. A conductive structure fabricated using such an architecture may exhibit an increase in device performance.

Figure 3A:
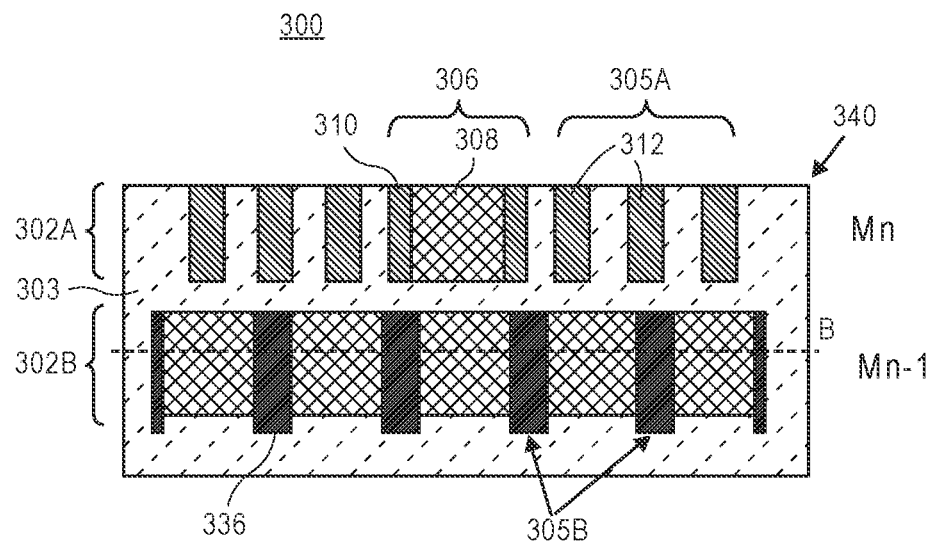
FIGS. 3A-3C are various views of a portion of an IC structure comprising a first conductive structure having first dummy structure, and a second conductive structure and having second dummy structure in accordance with various embodiments.
Figures 3B, 3C:
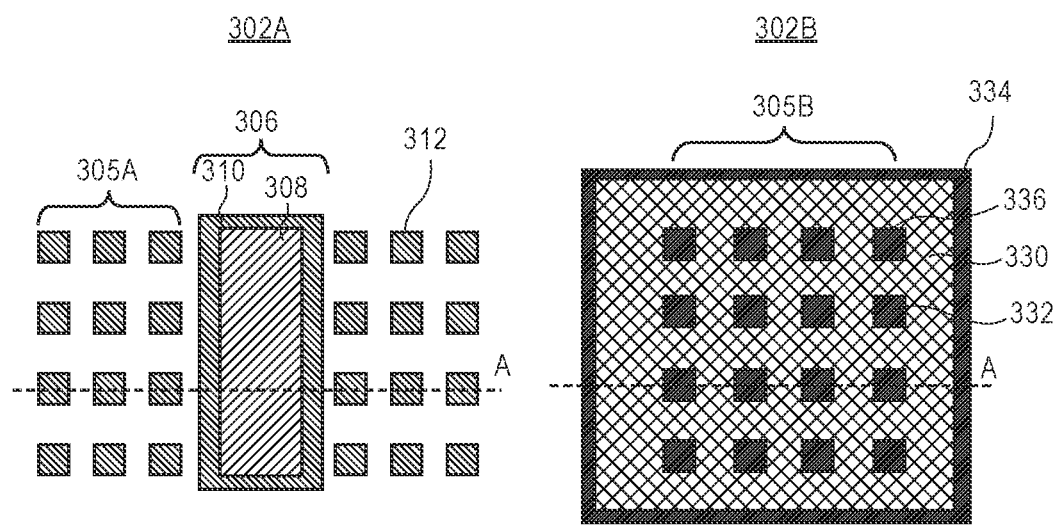

FIGS. 3A-3C are various views of a portion of an IC structure 300 comprising a first conductive structure 302A having first dummy structure 305A, and a second conductive structure and 302B having second dummy structure 305B in accordance with various embodiments. In particular, FIG. 3A is a side cross-sectional view of a portion of a metallization stack 340 of IC structure 300 (through the section line A of FIGS. 3B-3C). FIG. 3B is a plan view of the first conductive structure 302A of IC structure 100. And FIG. 3C is a top cross-sectional view of second conductive structure 302B of IC structure 100 (through the section B-B of FIG. 1A). The IC structure 100 may be any suitable IC structure, such as a die, a package substrate, an interposer, a circuit board, etc.

In this particular embodiment, both the first and second conductive structures 302A and 302B are formed in an interlayer dielectric (ILD) 303 of the metallization stack 340 over a substrate (not shown). The first conductive structure 302A is shown in a first metallization or metal layer (Mn), such as metal 2. The second conductive structure 302B is shown in a second metal layer (Mn−1) beneath the first metal layer.

The ILD 303 may include any suitable materials, such as silicon oxide or a carbon-doped silicon oxide film. In some embodiments first and second conductive structures 302A and 302B may span multiple metal layers in the metallization stack 340, while in other embodiments, the first and second conductive structures 302A and 302B may be confined to a single metal layer in the metallization stack 340. In some embodiments, the first conductive structure 302A may be included in a top metal layer of the metallization stack 340 (e.g., the layer of the metallization stack 340 that is farthest from the device layer), while the second conductive structure 302B may comprise a ground plane beneath the first conductive structure 302A.

Referring to FIGS. 3A and 3B, the first conductive structure 302A includes a first conductive line 306 and first dummy structures 305A. The first conductive structure 302A is shown comprising a single conductive line 306, such as an interconnect, but may comprises any number of conductive lines 306. The conductive line 306 may comprise a conductive fill material 308, such as copper, and a liner material 310 (e.g., a diffusion barrier liner or an adhesion liner).

Rather than use dummy structures 105 comprising relatively large squares of dielectric material 106, as shown in FIG. 1, the present embodiments utilize first dummy structures 305A located adjacent to one or more sides of the first conductive line 306, wherein the first dummy structures 305A comprise respective arrays of dielectric core segments 312 having a Young's modulus larger than the Young's modulus of the ILD 303 and are located adjacent to at least two sides of the first conductive line 306. In one embodiment, the dielectric core segments 312 are relatively small at approximately 1-3 microns in width and are spaced apart by approximately 1-3 microns, but the arrays may be of any size. In one embodiment, the term array means at least one column or row of one or more of the dummy structures 305A propagating in a direction parallel to a side of the first the conductive line 306. Although the dielectric core segments 312 are shown as comprising a square shape, the dielectric core segments 312 may be other polygonal shapes, arcuate, or a combination of both in shape.

In one embodiment, the first dummy structures 305A are located adjacent to two or more sides of the first conductive line 306, as shown in FIG. 3B. In FIG. 3B, one array of the dielectric core segments 312 is adjacent to one side of the first conductive line 306 and a second array is adjacent an opposite side of the first conductive line 306. In another embodiment, the first dummy structures 305A may be located adjacent to each side (two long sides, and two short sides) of the first conductive line 306. In yet another embodiment where the IC structure 300 comprises multiple conductive lines 306, the first set of dummy structures 305A may be located adjacent to each of the multiple conductive lines 306.

According to the disclosed embodiments, use of the first set of dummy structures 305A mitigate polish dishing such that top surfaces of the conductive line 306, the ILD 303, and the dummy structures 305A form a solid, substantially horizontal plane. The dielectric core segments 312 may be fabricated by depositing a non-conductive conformal material without adding additional masks, as will be described further below.

Figure 4:
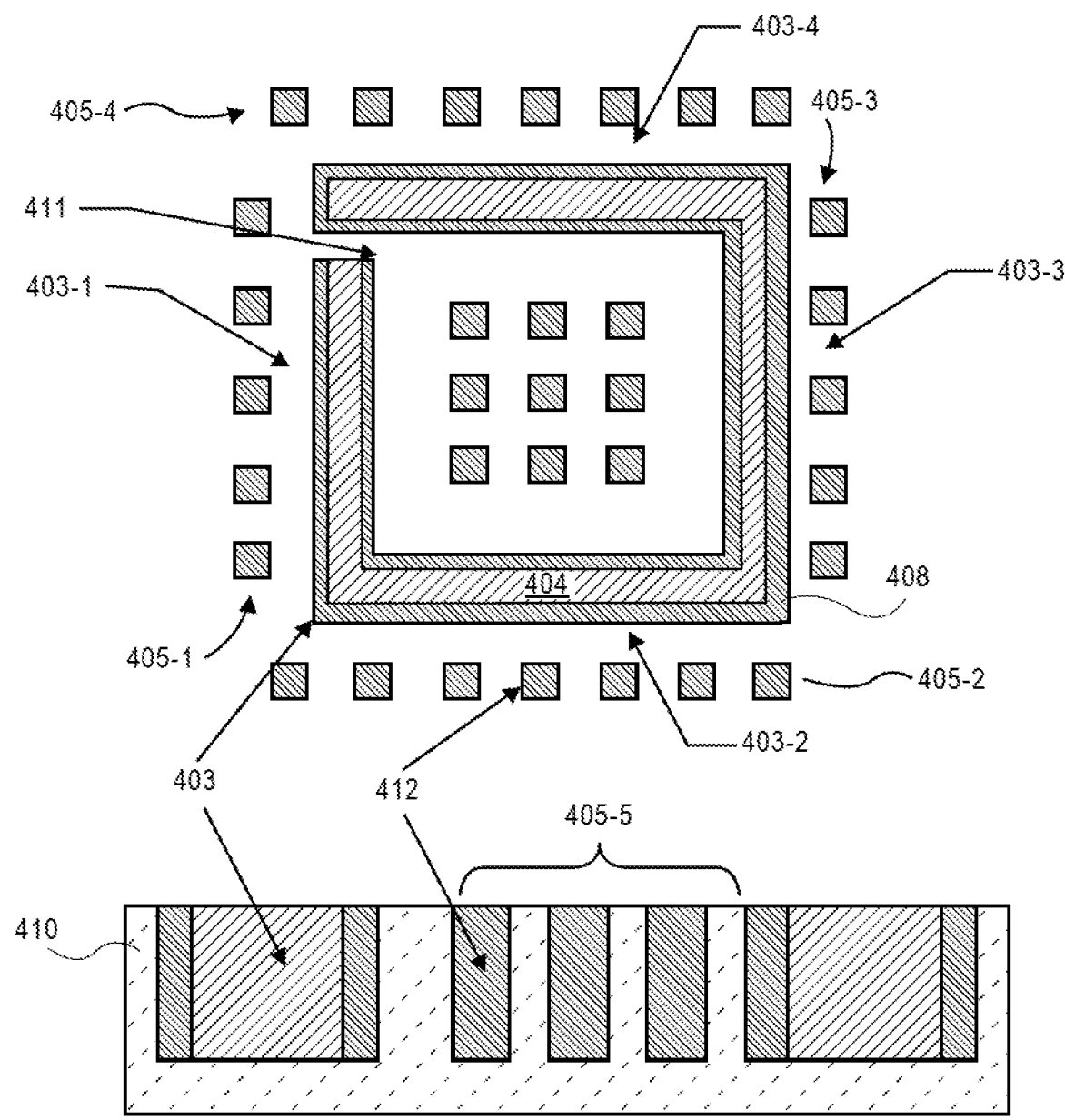
FIG. 4 shows a plan view and a cross-section view of an embodiment of a conductive structure and associated dummy structures, where the conductive structure comprises an inductor.

FIG. 4 shows a plan view and a cross-section view of an embodiment of a conductive structure and associated dummy structures, where the conductive structure comprises an inductor. The inductor 403 is formed in an ILD 410 of a single interconnect layer of a metallization stack. The inductor 403 comprises four conductive interconnect segments 403-1, 403-2, 403-3, 403-4 arranged generally in the shape of a square having an open interior 411. The conductive interconnect segments 403-1, 403-2, 403-3, 403-4 may comprise a conductive fill material 404, such as copper, and a liner material 408 (e.g., a diffusion barrier liner or an adhesion liner). In some embodiments, the liner material 408 may include tantalum or silicon nitride, and the conductive fill material 404 may be a metal (e.g., copper). In other embodiments, the conductive interconnect segments 403-1, 403-2, 403-3, 403-4 may have other compositions (e.g., multiple or no liner materials). The particular shape of the inductor 403 is simply illustrative, and the inductor may have a different shape (e.g., a triangle, a hexagon, an octagon, a spiral in the z-direction, etc.).

In accordance with the present embodiments, respective dummy structures comprising arrays 405-1, 405-2, 405-3, 405-4 and 405-5 of dielectric core segments 412 having a Young's modulus larger than the Young's modulus of the ILD 410 are located adjacent to each side of the inductor 403. More specifically, arrays 405-1, 405-2, 405-3, and 405-4 are adjacent to corresponding outer sides of the conductive interconnect segments 403-1, 403-2, 403-3, 403-4, and array 405-5 is located in the interior 411 of the inductor 403. The dielectric core segments 412 may comprise a dielectric material or a ferromagnetic material. Examples of dielectric dummy materials may include silicon carbide, silicon nitride, aluminum oxide, or another suitable carbide, nitride, or oxide. Examples of ferromagnetic dummy materials may include nickel, cobalt, or iron materials (e.g., materials in which particles of nickel, cobalt, or iron are included in a curable fluid that hardens to an appropriate Young's modulus). When the dummy structures 405 have a higher Young's modulus than the ILD 440, dishing or other deformation during polishing may be mitigated to form a solid, substantially horizontal plane along a top surface, as shown in the cross-section view.

The particular number and arrangement of dummy structures 405 in FIG. 4 is simply illustrative, and any number and arrangement of dummy structures 405 may be associated with the inductor 403 (or, more generally, in the metallization stack). In some embodiments, the inductor 403 may be part of power circuitry (e.g., in a buck-boost converter or other circuitry to support different voltage domains across a die) or part of radio frequency (RF) circuitry (e.g., communications circuitry), for example.

Referring again to FIG. 3A, in an embodiment where the IC structure 300 comprises printed circuit board, the first conductive line 306 may include a second conductive line coupled to the first, and/or one or more conductive vias, and the first conductive line 306 may be coupled to the second conductive structure 302B, which may comprise ground plane.

Referring now to FIGS. 3A and 3C, the second conductive structure 302B formed in a second metal level of the ILD will now be explained. In this embodiment, the second conductive structure 302B may be a ground plane, which is generally a large planar or substantially planar conductive surface 330 typically comprising a metal such as copper. Design rules typically require the ground plane to have extremely high metal density. According to the disclosed embodiments, rather than using dielectric pillars to mitigate polish dishing, the second conductive structure 302B further includes second dummy structures 305B formed in the conductive surface 330 that comprise an array of conductive pillars 332.

In one embodiment, the conductive surface 330 comprises a first metal material and the conductive pillars 332 comprise a second metal material. Using two types of metal help obtain the metal density requirement imposed by design rules, but during fabrication the two metals are deposited and/or etched/polished at different times without additional lithographic masks. In one embodiment, the first and second metals may be the same. In another embodiment, the first and second metals may be different metal materials. In one embodiment, the first and second metal material may be selected from a group comprising copper, cobalt and tungsten.

In a further embodiment, the second conductive structure 302B may further include a conductive border 334 surrounding the sides the conductive surface 330 of the ground plane. In one embodiment, the conductive border 334 comprises the same second metal material comprising the conductive pillars 332. In addition, the conductive pillars 332 may optionally include a liner 336 formed along sides and bottom the conductive pillars 332. The liner 336 may be a metal diffusion barrier liner and may comprise a material selected from a group comprising tantalum, tantalum nitride, titanium, titanium nitride, aluminum oxide (e.g., Al2O3), manganese, and manganese nitride. In more specific embodiments, when the first metal material of the ground plane is copper or cobalt, the liner material may comprise tantalum or tantalum nitride; and when the first metal comprises tungsten, the liner material may comprise titanium nitride.

The IC components 300 disclosed herein may be manufactured using any suitable techniques. In some embodiments, as noted above, a respective patterning operation (e.g., with one lithographic mask) may be performed to form the conductive structures 302A and 302B, and another respective patterning operation (e.g., with another patterning mask) may be performed to form the corresponding dummy structures 305A and 305B. In other embodiments, a single-mask technique may be used in which the conductive structures and corresponding dummy structures are patterned simultaneously. As noted above, such single-mask techniques may advantageously reduce cost, reduce manufacturing time, and/or improve relative alignment of the patterned features. FIGS. 5A-5D, 6A-6I and 6H-A to 6H-D illustrate stages in examples of such a process of manufacturing the IC component 300 of FIG. 3A, in accordance with various embodiments.

Figure 5A:
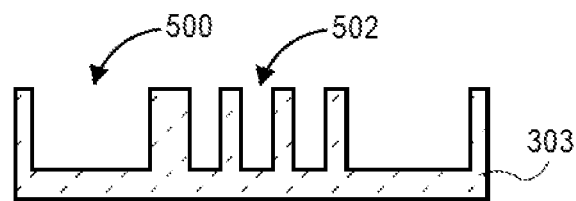
FIGS. 5A-5D illustrates cross-sectional views of a process for fabricating the first conductive structure comprising the first conductive line and associated first dummy structures.

FIGS. 5A-5D illustrates cross-sectional views of a process for fabricating the first conductive structure 302A comprising the first conductive line 306 and associated first dummy structures 305A of FIGS. 3A and 3B, where like components from FIGS. 3A and 3B have like reference numerals. FIG. 5A illustrates the fabrication process after conductive structure cavities 500 and dummy structure cavities 502 are formed in an ILD 303 via pattern and etch steps. The conductive structure cavities 500 and the dummy structure cavities 502 may be patterned simultaneously using a single lithographic mask and subsequent etching operations. The conductive structure cavities 500 may be formed such that first conductive line 306 is at least 4 microns in width and approximately 2-10 microns in height. The dummy structure cavities 124 may be formed such that the dummy structures 305A are equal to the width discussed above. Note that the width of the dummy structure cavities 502 should be less than the width of the conductive structure cavities 500.

Figure 5B:
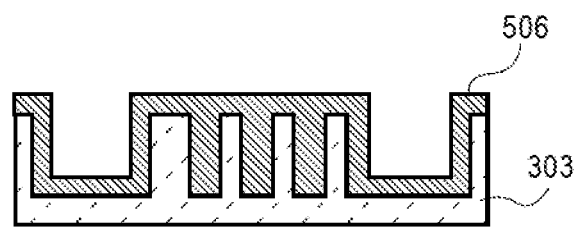

FIG. 5B illustrates the fabrication process after a dielectric (or ferromagnetic) material 506 is conformally deposited over the ILD 303, where the dielectric material 506 has a Young's modulus larger than the Young's modulus of the ILD. The dielectric material 506 may have a different material composition than the ILD 303 and may be deposited using any suitable technique (e.g., atomic layer deposition (ALD)). In the embodiment shown, the liner material 310 along borders of the first conductive line 306 comprises the same material as the dielectric material 506 and thus is formed by deposition of the dielectric material 506. In another embodiment, where the liner material 310 is different, the liner material 310 may be deposited in the conductive structure cavities 500 prior to depositing the dielectric material 506.

The dielectric material 506 may take any of the forms disclosed herein. In some embodiments, the dielectric material 506 may be a fillable or flowable material that can flow into the dummy structure cavities 502 even when the openings are fairly small; after flowing, the dielectric material 506 may then be cured. For example, in some embodiments, the dielectric material 506 may be silicon carbide that is spun on to the assembly. In some embodiments, the dielectric material 506 may be deposited by PVD. For example, the dielectric material 506 may be a ferroelectric metal deposited by PVD (e.g., to provide a magnetic core for an inductor, as discussed above). In some embodiments, the dielectric material 506 may be deposited using ALD or CVD (e.g., when the openings in the sacrificial blocking material 130 are larger).

Figure 5C:
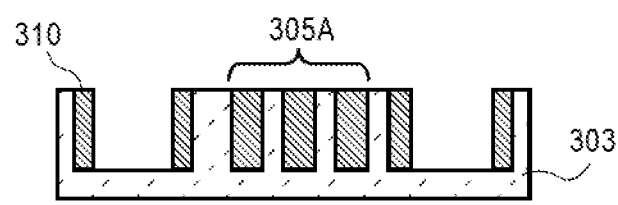

FIG. 5C illustrates the fabrication process after the dielectric material 506 (and optionally the liner material 310) is etched to remove the dielectric material 506 from the bottoms of the conductive structure cavities 500 and the dummy structure cavities 124. FIG. 5C also shows the dielectric material 506 subsequent to polishing to planarize the dielectric material 506 down to the top surface of the ILD 303 to form the dummy structures 305A and liner material 310 shown in FIGS. 3A and 3B. Any suitable polishing technique may be used, such as a chemical mechanical planarization (CMP) technique.

Figure 5D:
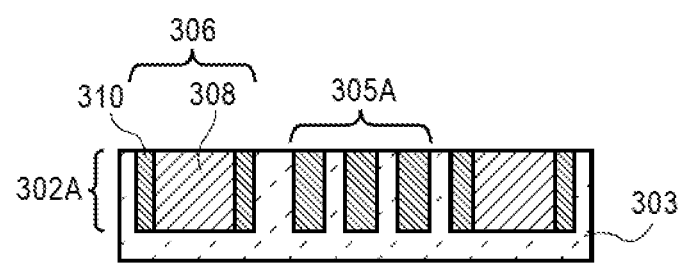

FIG. 5D illustrates the fabrication process after the conductive fill material 308 is conformally deposited in the conductive structure cavities 500, e.g., by deposition (e.g., by PVD or CVD) and polishing/planarizing, such as via CMP, to form the conductive line 306 comprising the conductive fill material 308, such as copper, and liner material 310. The separate polishing steps for the dielectric material 506 and the conductive fill material 308 effectively mitigates dishing to provide a first conductive structure 302A having a top surface formed as a substantially solid plane.

FIGS. 6A-6I illustrates cross-sectional views of a process for fabricating the second conductive structure 302B comprising the conductive surface 330 and second dummy structures 305B formed in the conductive surface of FIGS. 3A and 3C, where like components from FIGS. 3A and 3C have like reference numerals. Referring to FIG. 3A, it should be understood that the second conductive structure 302B would be fabricated in the ILD 303 prior to fabrication of the first conductive structure 302A. Also, in this embodiment formation of optional liners 336 is not shown.

Figure 6A:
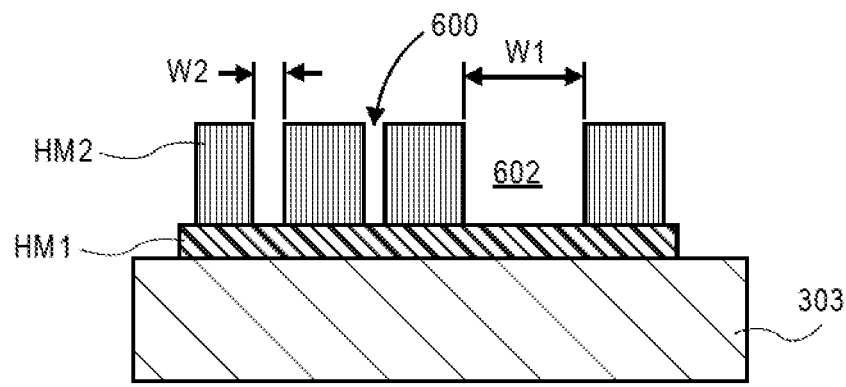
FIGS. 6A-6I, and 6H-A to 6H-D illustrates cross-sectional views of a process for fabricating the second conductive structure comprising the conductive surface and second dummy structures.

FIG. 6A illustrates the fabrication process after a first hardmask (HM1) has been formed over ILD 340 and second photoresist or hardmask HM2 is formed over the first hardmask with first openings 600 and larger second openings 602. The patterned second hardmask HM2 defines locations where the conductive structure 302B will be formed, while first openings 600 define locations where the conductive pillars 332 will be formed. Per sub-design rules, the first openings 600 may define the width (W2) between the conductive pillars 332 in the array, while the larger second openings 602 may define the width (W1) between a border of the conductive surface 330 and the array of conductive pillars 332.

Figure 6B:
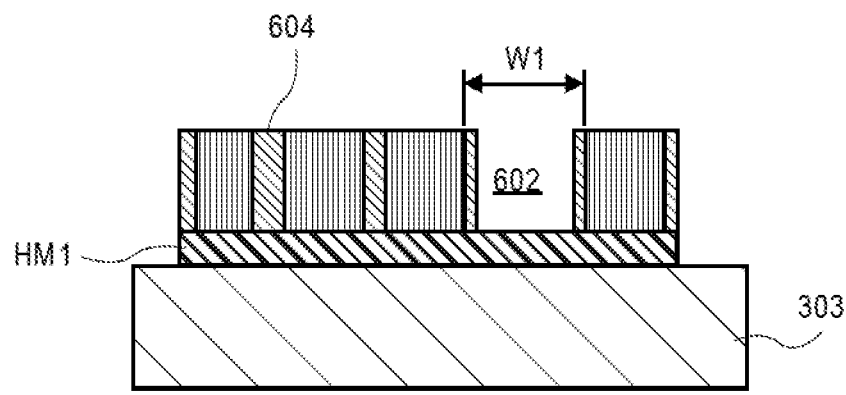

FIG. 6B illustrates the fabrication process after the sacrificial material 604 is formed in the opening 600 through deposition and etching, and the sacrificial material 604 and the first hardmask HM1 are etched down to the ILD 303 in large openings 602. Note, the sacrificial material 604 is etched in the larger second openings 602 such that a portion of the sacrificial material 604 remains along sidewalls of the larger second openings 602.

Figure 6C:
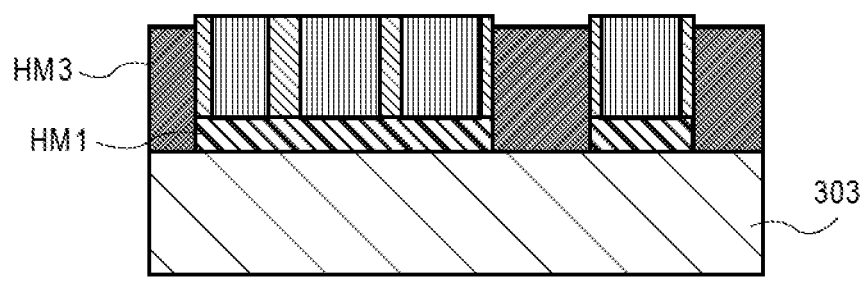

FIG. 6C illustrates the fabrication process after a conformal third hardmask (HM3) is backfilled in the larger second openings 602.

Figure 6D:
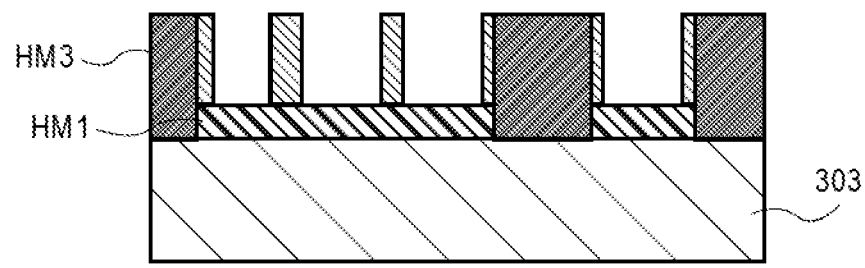

FIG. 6D illustrates the fabrication process after the second hardmask HM2 is removed, creating spaces that will define locations for the conductive surface 330 in the ILD 303.

Figure 6E:
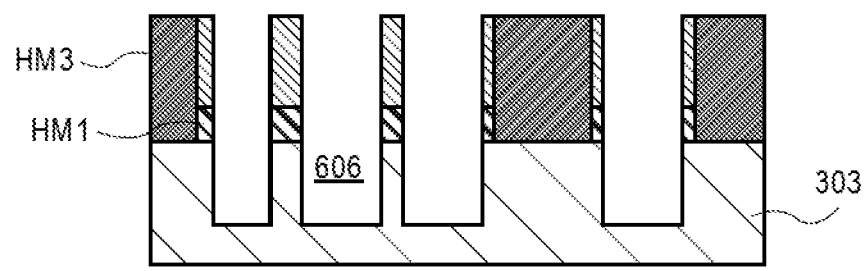

FIG. 6E illustrates the fabrication process after performing a trench etch in the ILD 303 to form conductive surface trenches 606.

Figure 6F:
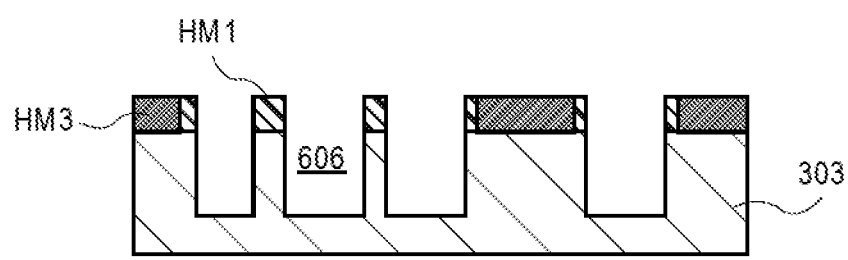

FIG. 6F illustrates the fabrication process after the sacrificial material 604 is removed, and the third hardmask HM3 is etched back to be coplanar with the first hardmask HM1.

Figure 6G:
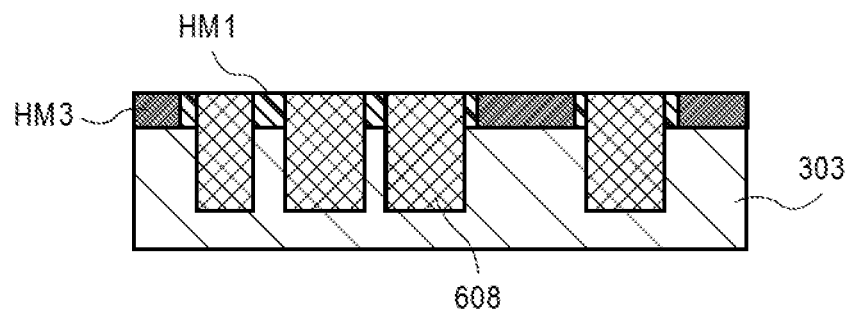

FIG. 6G illustrates the fabrication process after the conductive surface trenches 606 are filled with the first metal material 608 and the first metal material 608 is polished, e.g., via chemical mechanical polishing (CMP), to form the conductive surface 330.

Figure 6H:
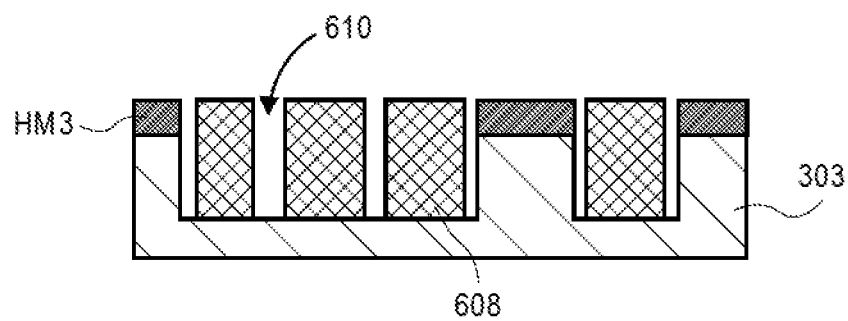
Figure 6I:
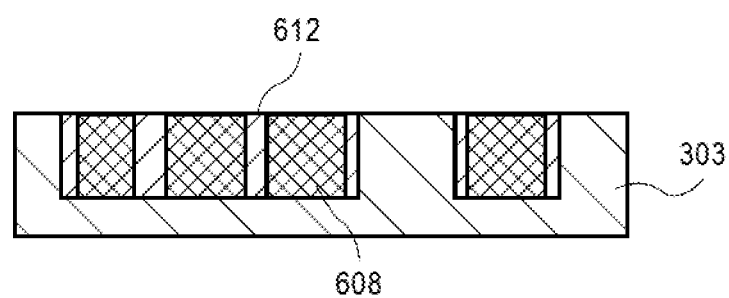

FIGS. 6H and 6I illustrate one embodiment for completing fabrication of the array of conductive pillars 302 comprising the second dummy structures 305B. FIG. 6H illustrates the fabrication process after the first hardmask HM1 is removed followed by a trench etch of the ILD 303 in locations of the removed HM1 to form conductive pillar trenches 610. FIG. 6I illustrates fabrication process after the conductive pillar trenches 610 are filled with the second metal material, the third hardmask HM3 is removed, and the second metal material 612 is polished to form the conductive pillars 332.

FIGS. 6H-A to 6H-D illustrate another embodiment for completing the fabrication process for the second conductive structure, which may lead to an easier polish solution for the second metal fill. FIGS. 6H-A, 6H-B are performed prior to forming the conductive pillar trenches the ILD and filling with the second metal material 612 to form the conductive pillars 332. FIG. 6H-A illustrates the fabrication process after the first metal material 608 is recess below a surface of the ILD 303. FIG. 6H-B illustrates the fabrication process after the recesses are filled with a fourth hardmask HM4, which is formed coplanar to HM1 and HM4. FIG. 6H-C illustrates the fabrication process after the first hardmask HM1 is etched followed by a trench etch of the ILD 303 to form conductive pillar trenches 610 in the ILD 303. FIG. 6H-D illustrates fabrication process after the conductive pillar trenches 610 are filled with the second metal material, the third hardmask HM3 is removed, and the second metal material 612 is polished to form the conductive pillars 332.

The integrated circuit structures described herein may be included in an electronic device. As an example of one such apparatus, FIGS. 7A and 7B are top views of a wafer and dies that include one or more conductive structures having improved core/pillar fill that mitigate polish dishing, in accordance with one or more of the embodiments disclosed herein.

Figure 7B:
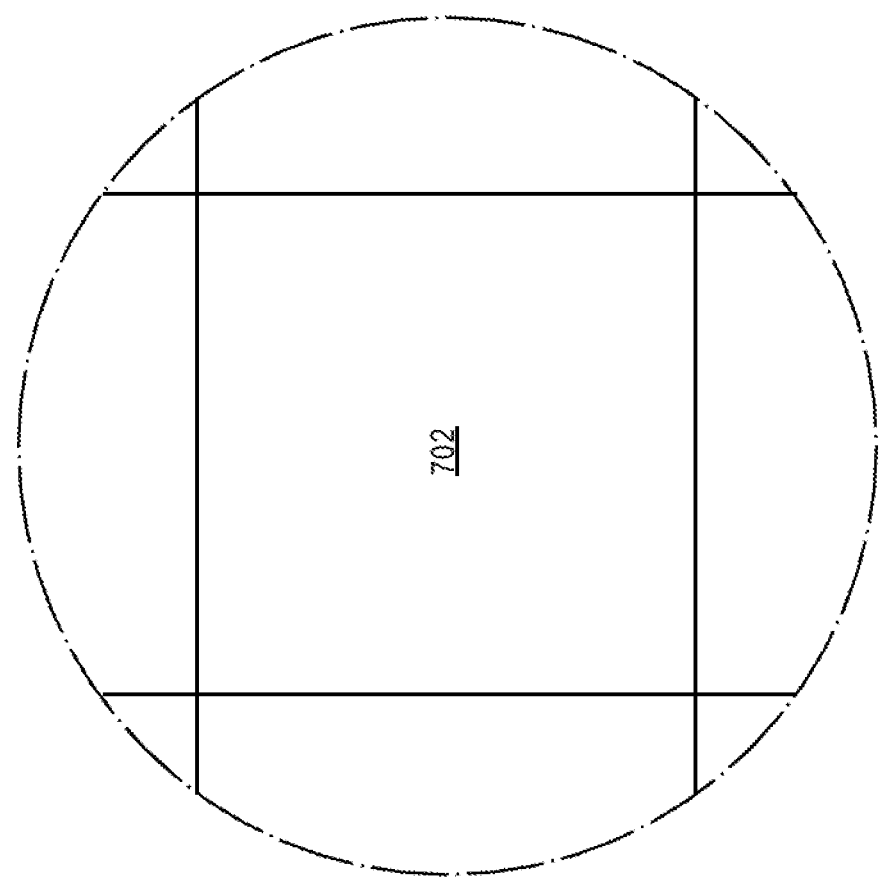
FIGS. 7A and 7B are top views of a wafer and dies that include one or more conductive structures having improved core/pillar fill that mitigate polish dishing, in accordance with one or more of the embodiments disclosed herein.
Figure 7A:
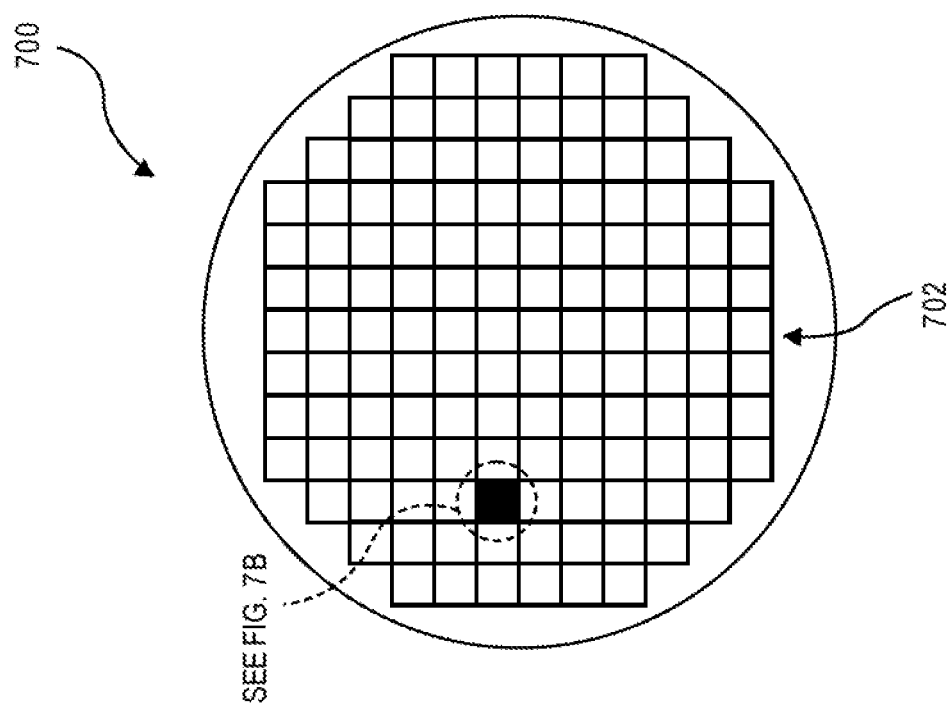

Referring to FIGS. 7A and 7B, a wafer 700 may be composed of semiconductor material and may include one or more dies 702 having integrated circuit (IC) structures formed on a surface of the wafer 700. Each of the dies 702 may be a repeating unit of a semiconductor product that includes any suitable IC (e.g., ICs including one or more conductive structures having improved core/pillar fill that mitigate polish dishing, such as described above. After the fabrication of the semiconductor product is complete, the wafer 700 may undergo a singulation process in which each of the dies 702 is separated from one another to provide discrete "chips" of the semiconductor product. In particular, structures that include embedded non-volatile memory structures having an independently scaled selector as disclosed herein may take the form of the wafer 700 (e.g., not singulated) or the form of the die 702 (e.g., singulated). The die 702 may include one or more embedded non-volatile memory structures based independently scaled selectors and/or supporting circuitry to route electrical signals, as well as any other IC structures. In some embodiments, the wafer 700 or the die 702 may include an additional memory device (e.g., a static random access memory (SRAM) device), a logic device (e.g., an AND, OR, NAND, or NOR gate), or any other suitable circuit element. Multiple ones of these devices may be combined on a single die 702. For example, a memory array formed by multiple memory devices may be formed on a same die 702 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
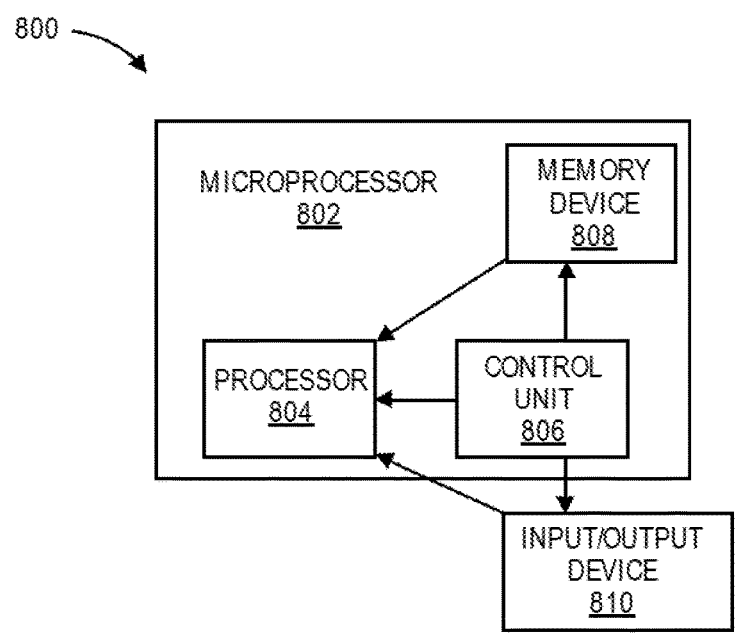
FIG. 8 illustrates a block diagram of an electronic system, in accordance with an embodiment of the present disclosure.

FIG. 8 illustrates a block diagram of an electronic system 800, in accordance with an embodiment of the present disclosure. The electronic system 800 can correspond to, for example, a portable system, a computer system, a process control system, or any other system that utilizes a processor and an associated memory. The electronic system 800 may include a microprocessor 802 (having a processor 804 and control unit 806), a memory device 808, and an input/output device 810 (it is to be appreciated that the electronic system 800 may have a plurality of processors, control units, memory device units and/or input/output devices in various embodiments). In one embodiment, the electronic system 800 has a set of instructions that define operations which are to be performed on data by the processor 804, as well as, other transactions between the processor 804, the memory device 808, and the input/output device 810. The control unit 806 coordinates the operations of the processor 804, the memory device 808 and the input/output device 810 by cycling through a set of operations that cause instructions to be retrieved from the memory device 808 and executed. The memory device 808 can include a non-volatile memory cell as described in the present description. In an embodiment, the memory device 808 is embedded in the microprocessor 802, as depicted in FIG. 8. In an embodiment, the processor 804, or another component of electronic system 800, includes one or more conductive structures having improved core/pillar fill that mitigate polish dishing, such as those described herein.

Figure 9:
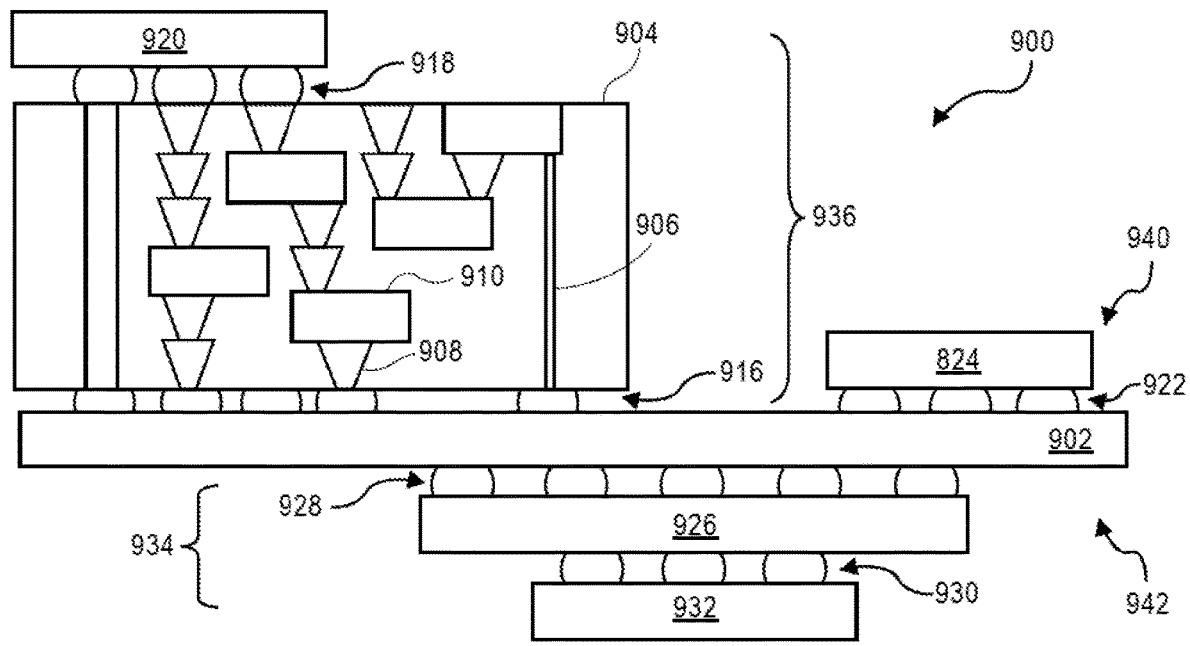
FIG. 9 is a cross-sectional side view of an integrated circuit (IC) device assembly that may include one or more conductive structures having improved core/pillar fill that mitigate polish dishing, in accordance with one or more of the embodiments disclosed herein.

FIG. 9 is a cross-sectional side view of an integrated circuit (IC) device assembly that may include one or more conductive structures having improved core/pillar fill that mitigate polish dishing, in accordance with one or more of the embodiments disclosed herein.

Referring to FIG. 9, an IC device assembly 900 includes components having one or more integrated circuit structures described herein. The IC device assembly 900 includes a number of components disposed on a circuit board 902 (which may be, e.g., a motherboard). The IC device assembly 900 includes components disposed on a first face 940 of the circuit board 902 and an opposing second face 942 of the circuit board 902. Generally, components may be disposed on one or both faces 940 and 942. In particular, any suitable ones of the components of the IC device assembly 900 may include a number of conductive structures having improved core/pillar fill that mitigate polish dishing, such as disclosed herein.

In some embodiments, the circuit board 902 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 902. In other embodiments, the circuit board 902 may be a non-PCB substrate.

The IC device assembly 900 illustrated in FIG. 9 includes a package-on-interposer structure 936 coupled to the first face 940 of the circuit board 902 by coupling components 916. The coupling components 916 may electrically and mechanically couple the package-on-interposer structure 936 to the circuit board 902, and may include solder balls (as shown in FIG. 9), male and female portions of a socket, an adhesive, an underfill material, and/or any other suitable electrical and/or mechanical coupling structure.

The package-on-interposer structure 936 may include an IC package 920 coupled to an interposer 904 by coupling components 918. The coupling components 918 may take any suitable form for the application, such as the forms discussed above with reference to the coupling components 916. Although a single IC package 920 is shown in FIG. 9, multiple IC packages may be coupled to the interposer 904. It is to be appreciated that additional interposers may be coupled to the interposer 904. The interposer 904 may provide an intervening substrate used to bridge the circuit board 902 and the IC package 920. The IC package 920 may be or include, for example, a die (the die 702 of FIG. 7B), or any other suitable component. Generally, the interposer 904 may spread a connection to a wider pitch or reroute a connection to a different connection. For example, the interposer 904 may couple the IC package 920 (e.g., a die) to a ball grid array (BGA) of the coupling components 916 for coupling to the circuit board 902. In the embodiment illustrated in FIG. 9, the IC package 920 and the circuit board 902 are attached to opposing sides of the interposer 904. In other embodiments, the IC package 920 and the circuit board 902 may be attached to a same side of the interposer 904. In some embodiments, three or more components may be interconnected by way of the interposer 904.

The interposer 904 may be formed of an epoxy resin, a fiberglass-reinforced epoxy resin, a ceramic material, or a polymer material such as polyimide. In some implementations, the interposer 904 may be formed of alternate rigid or flexible materials that may include the same materials described above for use in a semiconductor substrate, such as silicon, germanium, and other group III-V and group IV materials. The interposer 904 may include metal interconnects 910 and vias 908, including but not limited to through-silicon vias (TSVs) 906. The interposer 904 may further include embedded devices 914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 904. The package-on-interposer structure 936 may take the form of any of the package-on-interposer structures known in the art.

The IC device assembly 900 may include an IC package 924 coupled to the first face 940 of the circuit board 902 by coupling components 922. The coupling components 922 may take the form of any of the embodiments discussed above with reference to the coupling components 916, and the IC package 924 may take the form of any of the embodiments discussed above with reference to the IC package 920.

The IC device assembly 900 illustrated in FIG. 9 includes a package-on-package structure 934 coupled to the second face 942 of the circuit board 902 by coupling components 928. The package-on-package structure 934 may include an IC package 926 and an IC package 932 coupled together by coupling components 930 such that the IC package 926 is disposed between the circuit board 902 and the IC package 932. The coupling components 928 and 930 may take the form of any of the embodiments of the coupling components 916 discussed above, and the IC packages 926 and 932 may take the form of any of the embodiments of the IC package 920 discussed above. The package-on-package structure 934 may be configured in accordance with any of the package-on-package structures known in the art.

Figure 10:
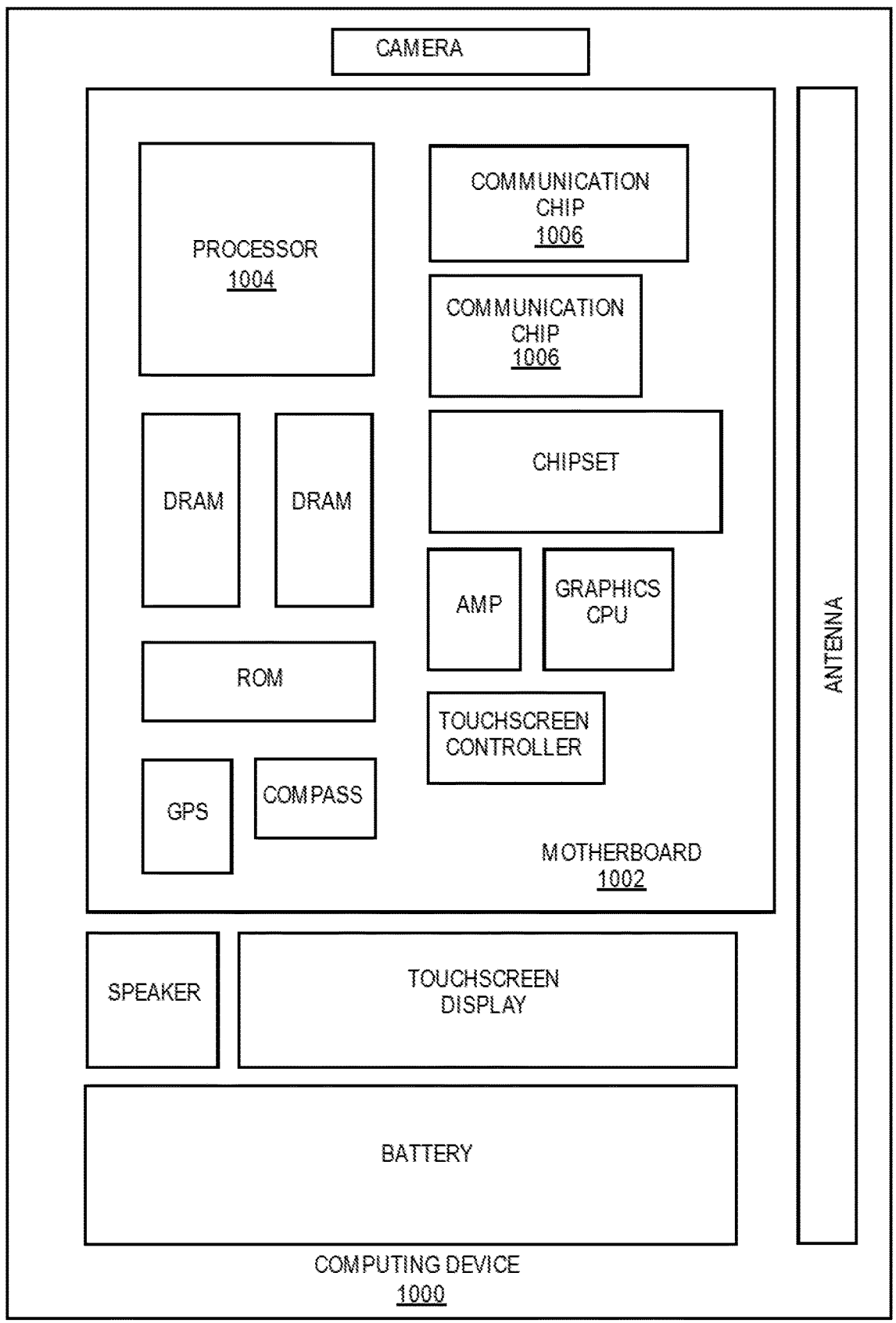
FIG. 10 illustrates a computing device in accordance with one implementation of the disclosure.

FIG. 10 illustrates a computing device 1000 in accordance with one implementation of the disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the disclosure, the integrated circuit die of the processor includes one or more conductive structures having improved core/pillar fill that mitigate polish dishing, in accordance with implementations of embodiments of the disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of embodiments of the disclosure, the integrated circuit die of the communication chip includes one or more conductive structures having improved core/pillar fill that mitigate polish dishing, in accordance with implementations of embodiments of the disclosure.

In further implementations, another component housed within the computing device 1000 may contain an integrated circuit die that includes one or more conductive structures having improved core/pillar fill that mitigate polish dishing, in accordance with implementations of embodiments of the disclosure.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Thus, embodiments described herein include conductive structures having improved core/pillar fill that mitigate polish dishing.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure comprises a first and second conductive structures formed in an interlayer dielectric (ILD) of a metallization stack over a substrate. The first conductive structure comprises a first conductive line, and first dummy structures located adjacent to one or more sides of the first conductive line, wherein the first dummy structures comprise respective arrays of dielectric core segments having a Young's modulus larger than the Young's modulus of the ILD, the dielectric core segments being approximately 1-3 microns in width and spaced apart by approximately 1-3 microns. The second conductive structure formed in the ILD comprises a conductive surface and second dummy structures formed in the conductive surface, where the second dummy structures comprising an array of conductive pillars.

Example embodiment 2: The integrated circuit structure of example embodiment 1, wherein the respective arrays of dielectric core segments of the first conductive structure propagate in a direction parallel to sides of the first conductive line.

Example embodiment 3: The integrated circuit structure of example embodiment 1 or 2, wherein the first dummy structures are located adjacent to two or more sides of the first conductive line.

Example embodiment 4: The integrated circuit structure of example embodiment 1, 2 or 3, wherein the first dummy structures comprise: a first array of the dielectric core segments adjacent to one side of the first conductive line and a second array of the dielectric core segments adjacent to an opposite side of the first conductive line.

Example embodiment 5: The integrated circuit structure of example embodiment 1, 2, 3 or 4, wherein the first dummy structures are located adjacent to each of the sides of the first conductive line.

Example embodiment 6: The integrated circuit structure of example embodiment 1, 2, 3, 4 or 5, further comprising multiple conductive lines, and wherein the first set of dummy structures are located adjacent to each of the multiple conductive lines.

Example embodiment 7: The integrated circuit structure of example embodiment 1, wherein the conductive surface of the second conductive structure comprises a first metal material and the conductive pillars comprise a second metal material.

Example embodiment 8: The integrated circuit structure of example embodiment 7, wherein the first metal material and the second metal material are a same metal material.

Example embodiment 9: The integrated circuit structure of example embodiment 7, wherein the first metal material and the second metal material are a different metal material.

Example embodiment 10: The integrated circuit structure of example embodiment 7, 8, or 9, wherein the first metal material and the second metal material are selected from a group comprising copper, cobalt and tungsten.

Example embodiment 11: The integrated circuit structure of example embodiment 7, 8, 9 or 10, wherein the second conductive structure further comprises a conductive border surrounding sides the conductive surface.

Example embodiment 12: The integrated circuit structure of example embodiment 7, 8, 9, 10 or 11, wherein the conductive border comprises a same second metal material as the conductive pillars.

Example embodiment 13: The integrated circuit structure of example embodiment 7, 8, 9, 10, 11 or 12, further comprising a liner formed along sides and bottom the conductive pillars.

Example embodiment 14: The integrated circuit structure of example embodiment 13, wherein the liner comprises a material selected from a group comprising tantalum, tantalum nitride, titanium, titanium nitride, aluminum oxide, manganese, and manganese nitride.

Example embodiment 15: The integrated circuit structure of example embodiment 7, 8, 9, 10, 11, 12, 13 or 14, wherein the conductive pillars are approximately 2×2 microns and a minimum size of the planar conductive surface is approximately 25×25 microns.

Example embodiment 16: The integrated circuit structure of example embodiment 1, 2, 3, 4, 5, 6, 7, 8, 9, 10, 11, 12, 13, 14 or 15, wherein the first conductive structure is in a first metal layer (Mn), and the second conductive structure is in a second metal layer (Mn−1) beneath the first metal layer.

Example embodiment 17: The integrated circuit structure of example embodiment 1, 2, 3, 4, 5, 6, 7, 8, 9, 10, 11, 12, 13, 14, 15 or 16, wherein the ILD comprises a material selected from a group comprising silicon oxide and a carbon-doped silicon oxide film.

Example embodiment 18: A method of fabricating a conductive structure, the method comprises forming conductive structure cavities and dummy structure cavities in an interlayer dielectric (ILD). A dielectric or ferromagnetic material is conformally deposited over the ILD, wherein the dielectric material has a Young's modulus larger than the Young's modulus of the ILD. The dielectric or ferromagnetic material is etched to remove the dielectric or ferromagnetic material from the bottoms of the conductive structure cavities and the dummy structure cavities. The dielectric or ferromagnetic material is planarized down to a top surface of the ILD to form dummy structures. And a conductive fill material is conformally deposited in the conductive structure cavities and planarized to form a conductive line.

Example embodiment 19: The method of example embodiment 18, further comprising: forming the dummy structures adjacent to one or more sides of the conductive line, wherein the first dummy structures comprise respective arrays of dielectric core segments having a width of approximately 1-3 microns and spaced apart by approximately 1-3 microns.

Example embodiment 20: The method of example embodiment 19, further comprising forming the respective arrays of dielectric core segments to propagate in a direction parallel to sides of the conductive line.

Example embodiment 21: The method of example embodiment 20 or 21, further comprising forming the dummy structures adjacent to two or more sides of the conductive line.

Example embodiment 22: A method of fabricating a conductive structure comprises forming a first hardmask in an interlayer dielectric (ILD) and forming a second hardmask over the first hardmask with first openings and larger second openings. A sacrificial material is formed in the first openings and larger second openings and the sacrificial material and the first hardmask are etched down to a surface of the ILD such that a portion of the sacrificial material remains along sidewalls of the larger second openings. The larger second openings are filled with a third hardmask. The second hardmask is removed. A trench etch is performed in the ILD to form conductive surface trenches. The sacrificial material is removed and the third hardmask is etched to be coplanar with the first hardmask. The conductive surface trenches are filled with a first metal material and the first metal material is polished to form a conductive surface. And the first hardmask is removed and conductive pillar trenches are formed in the ILD in locations defined by the removed first hardmask, and the conductive pillar trenches are filled with the second metal material to form conductive pillars.

Example embodiment 23: The method of example embodiment 22, further comprising prior to removing the first hardmask and forming conductive pillar trenches the first metal material is recessed below a surface of the ILD to form recesses; and the recesses is filled with a fourth hardmask.

Example embodiment 24: The method of example embodiment 22 or 23, further comprising using a different metal material for the first metal material and the second metal material.

Example embodiment 25: The method of example embodiment 22, 23 or 24, further selecting the first metal material and the second metal material from a group comprising copper, cobalt and tungsten.

What is claimed is:
1. An integrated circuit structure, comprising:
   a first conductive structure formed in an interlayer dielectric (ILD) of a metallization stack over a substrate, the first conductive structure comprising a first conductive line, and first linerless dummy structures located adjacent to one or more sides of the first conductive line, wherein the first linerless dummy structures are located in a first metal layer (Mn) and comprise respective arrays of dielectric core segments having a Young's modulus larger than the Young's modulus of the ILD, the respective arrays of dielectric core segments being approximately 1-3 microns in width and spaced apart by approximately 1-3 microns, wherein the respective arrays of dielectric core segments of the first conductive structure propagate in a direction parallel to sides of the first conductive line; and
   a second conductive structure formed in the ILD, the second conductive structure comprising a conductive surface and second dummy structures formed in the conductive surface, the second dummy structures are located in a second metal layer (Mn−1) beneath the first metal layer (Mn) and comprise an array of conductive pillars.

2. The integrated circuit structure of claim 1, wherein the first linerless dummy structures are located adjacent to two or more sides of the first conductive line.

3. The integrated circuit structure of claim 1, wherein the first linerless dummy structures comprise: a first array of the dielectric core segments adjacent to one side of the first conductive line and a second array of the dielectric core segments adjacent to an opposite side of the first conductive line.

4. The integrated circuit structure of claim 1, wherein the first linerless dummy structures are located adjacent to each of the sides of the first conductive line.

5. The integrated circuit structure of claim 1, further comprising multiple conductive lines, and wherein the first linerless dummy structures are located adjacent to each of the multiple conductive lines.

6. The integrated circuit structure of claim 1, wherein the conductive surface of the second conductive structure comprises a first metal material and the array of conductive pillars comprise a second metal material.

7. The integrated circuit structure of claim 6, wherein the first metal material and the second metal material are a same metal material.

8. The integrated circuit structure of claim 6, wherein the first metal material and the second metal material are a different metal material.

9. The integrated circuit structure of claim 6, wherein the first metal material and the second metal material comprise copper, cobalt or tungsten.

10. The integrated circuit structure of claim 6, wherein the second conductive structure further comprises a conductive border surrounding sides of the conductive surface.

11. The integrated circuit structure of claim 6, wherein a conductive border comprises a same second metal material as the array of conductive pillars.

12. The integrated circuit structure of claim 6, further comprising a liner formed along sides and bottom of the array of conductive pillars.

13. The integrated circuit structure of claim 12, wherein the liner comprises tantalum, tantalum nitride, titanium, titanium nitride, aluminum oxide, manganese, or manganese nitride.

14. The integrated circuit structure of claim 6, wherein the array of conductive pillars are approximately 2×2 microns and a minimum size of a planar conductive surface is approximately 25×25 microns.

15. The integrated circuit structure of claim 1, wherein the ILD comprises silicon oxide or a carbon-doped silicon oxide film.

* * * * *